(12) United States Patent
Beaumont et al.

(10) Patent No.: US 9,209,018 B2
(45) Date of Patent: Dec. 8, 2015

(54) SEMICONDUCTOR SUBSTRATE AND METHOD OF MANUFACTURING

(75) Inventors: Bernard Beaumont, Le Tignet (FR); Jean-Pierre Faurie, Valbonne (FR)

(73) Assignee: SAINT-GOBAIN CRISTAUX ET DETECTEURS, Courbevoie (FR)

( * ) Notice: Subject to any disclaimer, the term of this patent is extended or adjusted under 35 U.S.C. 154(b) by 114 days.

(21) Appl. No.: 13/534,491

(22) Filed: Jun. 27, 2012

(65) Prior Publication Data

US 2013/0001586 A1 Jan. 3, 2013

Related U.S. Application Data

(60) Provisional application No. 61/501,554, filed on Jun. 27, 2011.

(51) Int. Cl.
*H01L 29/15* (2006.01)
*H01L 21/02* (2006.01)

(52) U.S. Cl.
CPC ........ *H01L 21/0242* (2013.01); *H01L 21/0245* (2013.01); *H01L 21/0254* (2013.01); *H01L 21/0262* (2013.01); *H01L 21/02458* (2013.01); *H01L 21/02502* (2013.01); *H01L 2224/03848* (2013.01)

(58) Field of Classification Search
USPC .............................. 257/76, 183; 438/478, 438
See application file for complete search history.

(56) References Cited

U.S. PATENT DOCUMENTS

| | | | |
|---|---|---|---|
| 7,118,934 B2 | 10/2006 | Oshima et al. | |
| 7,196,399 B2 | 3/2007 | Usui et al. | |
| 2007/0141813 A1* | 6/2007 | Song | 438/483 |
| 2008/0067543 A1* | 3/2008 | Shin et al. | 257/183 |
| 2009/0155986 A1* | 6/2009 | Lee | 438/478 |
| 2009/0278136 A1 | 11/2009 | Beaumont et al. | |
| 2010/0044718 A1 | 2/2010 | Hanser et al. | |

FOREIGN PATENT DOCUMENTS

| | | |
|---|---|---|
| JP | 2006-173148 A | 6/2006 |
| KR | 10-2009-0062157 A | 6/2009 |

OTHER PUBLICATIONS

R. Singh et al. "Enhancement in wafer bow of free-standing GaN substrates due to high-dose hydrogen implantation: implications for GaN layer transfer applications" Semicond. Sci. Technol. 22 (2007) pp. 418-421.

Markus Weyers et al. "GaN substrates by HVPE" Light-Emitting Diodes: Research, Manufacturing, and Applications XII, edited by Klaus P. Streubel, Heonsu Jeon, Proc. of SPIE vol. 6910, 69100I, (2008) pp. 1-10.

Kim Doo Soo et al. "A thick GaN growth using GaN/Si(111) template by Hydride Vapor Phase Epitaxy(HVPE)" Gallium Nitride Materials and Devices III, edited by Hadis Morkoç, Cole W. Litton, Jen-Inn Chyi, Yasushi Nanishi, Euijoon Yoon, Proc. of SPIE vol. 6894, 689406, (2008) pp. 1-9.

(Continued)

*Primary Examiner* — Dale E Page
(74) *Attorney, Agent, or Firm* — Abel Law Group, LLP; Robert N Young

(57) ABSTRACT

A method for forming a substrate includes forming a base layer comprising a Group III-V material on a substrate, cooling the base layer and inducing cracks in the base layer, and forming a bulk layer comprising a Group III-V material on the base layer after cooling.

19 Claims, 4 Drawing Sheets

(56) References Cited

OTHER PUBLICATIONS

International Search Report for PCT/US2012/044329 dated Mar. 13, 2013, 4 pgs.
Fewster, Paul F., "X-Ray Scattering From Semiconductors", 1st ed. 1. World Scientific Publishing Company, 2001. p. 192-195.
Riemann, T. et al., "Microscopic Properties of Thick Free-Standing GaN-Pseudosubstrates Grown by HVPE on MOVPE-Elog Templates" Abstract of Oral Presentation presented at International Workshop on Nitride Semiconductors, Jul. 22-25, 2002, Aachen, Germany. 2 pgs.

* cited by examiner

SEMICONDUCTOR SUBSTRATE AND METHOD OF MANUFACTURING

CROSS-REFERENCE TO RELATED APPLICATION

This application claims priority under 35 U.S.C. §119(e) to U.S. Provisional Patent Application No. 61/501,554 entitled "A Semiconductor Substrate and Method of Manufacturing," by Beaumont et al., filed Jun. 27, 2011, which is assigned to the current assignee hereof and incorporated herein by reference in its entirety.

BACKGROUND

1. Field of the Disclosure

The following is generally related to substrates, and particularly, methods of forming substrates suitable for formation of electronic devices.

2. Description of the Related Art

Semiconductor-based compounds, including Group III-V materials, such as gallium nitride (GaN), ternary compounds, such as, indium gallium nitride (InGaN) and gallium aluminum nitride (GaAlN), and even the quaternary compounds (AlGaInN) are direct band gap semiconductors. Such materials have been recognized as having great potential for short wavelength emission, and thus suitable for use in the manufacturing of light emitting diodes (LEDs), laser diodes (LDs), UV detectors, and high-temperature electronics devices.

However, the development of such semiconductor materials has been hampered by difficulties surrounding the processing of such materials, particularly the formation of high-quality single crystalline forms of the material, which are required for manufacturing of short wavelength emission electronics. GaN is not found as a naturally occurring compound, and thus cannot be melted and pulled from a boule like silicon, gallium arsenide, or sapphire, because at usual pressures its theoretical melting temperature exceeds its dissociation temperature. As an alternative, the industry has turned to formation of bulk GaN crystals using epitaxial growth processes. However, problems still remain with the epitaxial approach, including the formation of suitable low defect density bulk GaN material.

The existence of extended defects (threading dislocations, stacking faults, and antiphase boundaries) leads to significantly deteriorated performances and results in a shortened operating lifetime of devices. More specifically, the dislocations behave as non-radiative centers, thus reducing the light-emitting efficiency of light-emitting diodes and laser diodes made from these materials. These dislocations also increase the dark current. Although threading dislocations have not prevented the development of high-brightness light-emitting diodes, the dislocations cause excessive reverse-bias leakage currents in p-n junction devices such as high-electron-mobility transistors, field-effect transistors and other electronic devices. Further, the dislocations can act as strong scattering centers for carriers, thus reducing the mobility of electrons and holes, limiting the performance of many semiconductor devices.

Improved substrates suitable for the formation of electronic devices thereon are in high demand within the industry.

SUMMARY

According to a first aspect, a method for forming a substrate includes forming a base layer comprising a Group III-V material on a substrate, cooling the base layer and inducing cracks in the base layer, and forming a bulk layer comprising a Group III-V material on the base layer after cooling.

According to another aspect, a method for forming a substrate includes forming a base layer comprising a Group III-V material on a substrate, cooling the base layer to a cooling temperature of less than about 600° C., forming a bulk layer comprising a Group III-V material on the base layer after cooling, wherein forming the bulk layer is completed using a three-dimensional (3D) epitaxial growth mode.

In still another aspect, a method for forming a substrate includes forming a random array of island features comprising a Group III-V material on a substrate, coalescing the random array of island features into a base layer as a continuous layer of uniform thickness comprising the Group III-V material, and cooling the base layer and forming cracks within the base layer. The method further includes forming a bulk layer including a Group III-V material on the base layer after cooling, wherein forming the bulk layer is completed using a three-dimensional (3D) growth mode.

According to yet another aspect, a substrate includes a body having a Group III-V material and a X-ray diffraction scan profile having a dual-peak signature for at least one measured point at a surface on the body, the dual-peak signature including a first peak and a second peak spaced apart from the first peak by not greater than about 2 degrees, and wherein the first peak has a first intensity significantly different than an intensity of the second peak.

In another aspect, a substrate includes a body having gallium nitride and a X-ray diffraction scan profile defining a dual-peak signature for at least one measured point at a surface on the body, the dual-peak signature including a first peak and a second peak spaced apart from the first peak by not greater than about 2 degrees, wherein the first peak intensity (PI1) and the second peak intensity (PI2) differ by at least 5% based on the equation $\Delta PI=[(PI1-PI2)/PI1]\times 100\%$, wherein PI1 is greater than PI2.

A substrate including a body consisting of gallium nitride having a X-ray diffraction scan profile defining a dual-peak signature for at least one measured point at a surface on the body, the dual-peak signature including a first peak and a second peak spaced apart from the first peak by not greater than about 2 degrees. The first peak intensity (PI1) and the second peak intensity (PI2) differ by at least 5% based on the equation $\Delta PI=[(PI1-PI2)/PI1]\times 100\%$, wherein PI1 is greater than PI2. And the body has a bow of not greater than about 200 microns.

BRIEF DESCRIPTION OF THE DRAWINGS

The present disclosure may be better understood, and its numerous features and advantages made apparent to those skilled in the art by referencing the accompanying drawings.

DETAILED DESCRIPTION

The following is generally directed to substrate materials, and particular, substrates made of a semiconductor material, which can be used in fabrication of electronic devices. More particularly, substrates of the embodiments herein may be used in the formation of light emitting diodes (LEDs) or laser diodes (LDs). The substrates of the embodiment can include a Group III-V material including for example gallium nitride (GaN). It will be appreciated that reference to Group III-V materials, include compounds having at least one element from Group III of the Periodic Table of Elements and at least one element from Group V of the Periodic Table of Elements.

Figure 1:
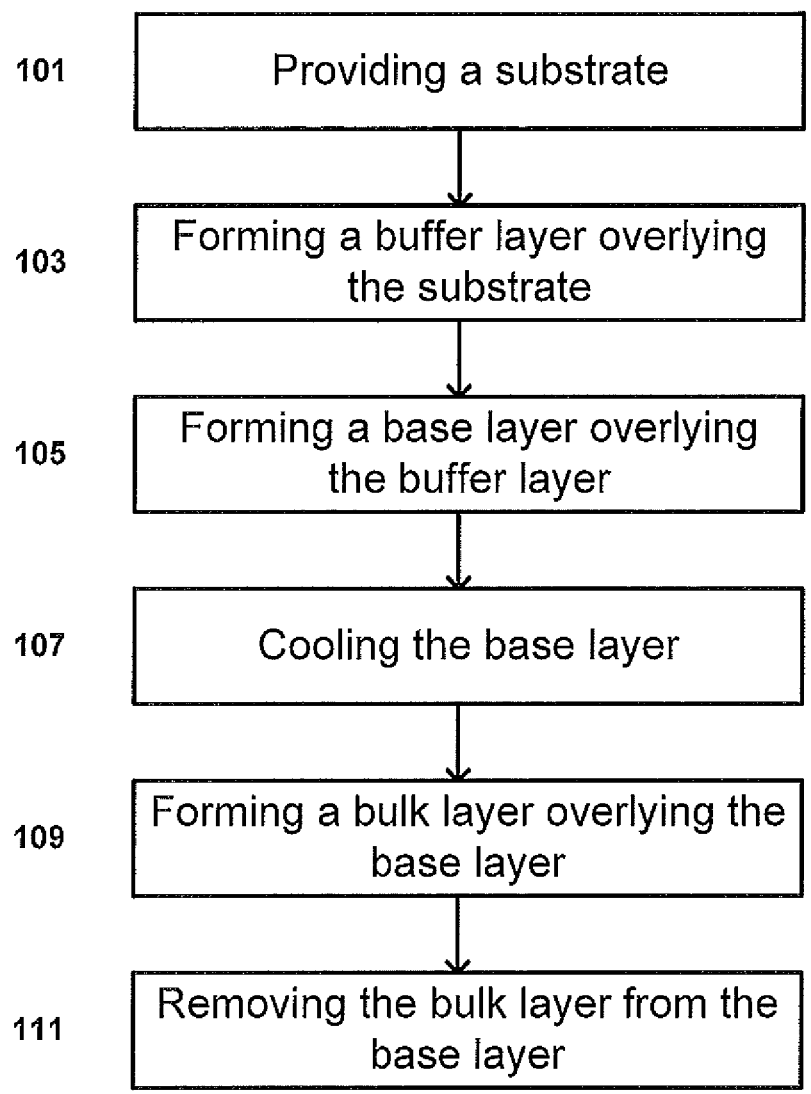
FIG. 1 includes a flowchart providing a method for forming a substrate for use in electronic device fabrication in accordance with embodiment.

FIG. 1 includes a flow chart illustrating a method for forming a semiconductor substrate comprising a semiconductor material suitable for fabrication of electronic devices thereon in accordance with the embodiment. As illustrated, the process is initiated at step 101 by providing a substrate, also referred to as a template substrate. The template substrate can be a structure suitable for supporting a plurality of layers formed thereon, and function as a heteroepitaxial support structure for the formation of a plurality of layers thereon.

In accordance with one embodiment, the template substrate can be an inorganic material. Some suitable inorganic materials can include oxides, carbides, nitrides, borides, oxycarbides, oxyborides, oxynitrides, and a combination thereof. In certain instances the template substrate can include alumina, and more particularly, may include single crystal alumina (i.e., sapphire). One embodiment utilizes a substrate consisting essentially of sapphire.

Figure 2A:
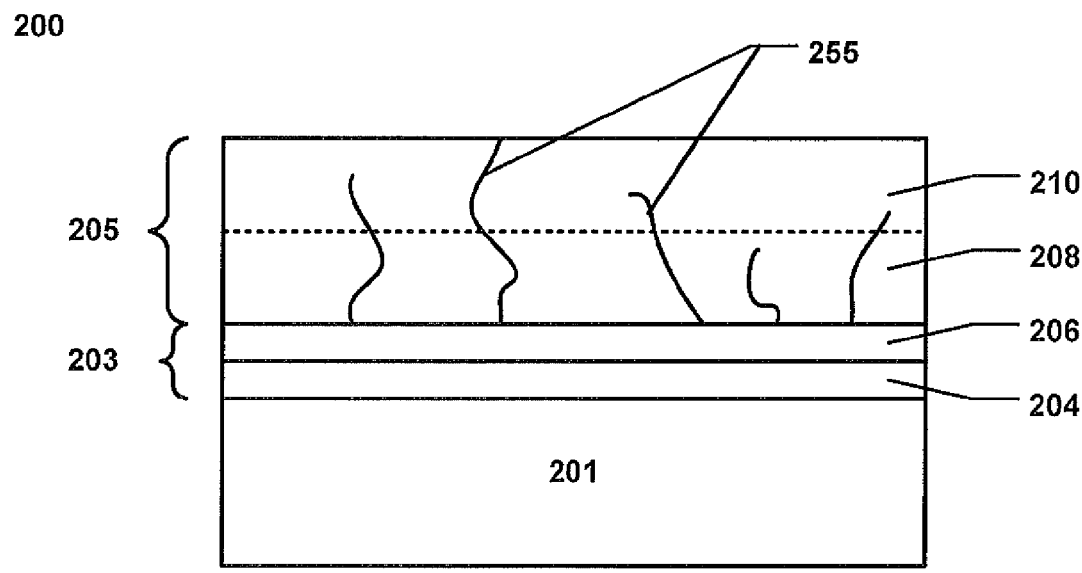
FIGS. 2A-2D include illustrations of a process for forming a substrate in accordance with an embodiment.

The process can continue at step 103 by forming a buffer layer overlying the substrate. Turning briefly to FIG. 2A, a semiconductor substrate 200 is illustrated in accordance with embodiment. Notably, the semiconductor substrate 200 can include a substrate 201 (i.e., template substrate) and a buffer layer 203 overlying the substrate 201. In particular, the buffer layer 203 can overlie an upper major surface of the substrate 201, and more particularly, the buffer layer 203 can be in direct contact with the upper major surface of the substrate 201.

Forming the buffer layer 203 can include a deposition process. For example, the substrate can be loaded into a reaction chamber, and after providing a suitable environment within the reaction chamber, a buffer layer can be deposited on the substrate. According to one embodiment, a suitable deposition technique can include chemical vapor deposition. In one particular instance, the deposition process can include metal-organic chemical vapor deposition (MOCVD).

The buffer layer 203 may be formed from a plurality of films. For example, as illustrated in FIG. 2A, the buffer layer 203 can include a film 204 and a film 206. In accordance with an embodiment, at least one of the films, can include a crystalline material. In more particular instances, the film 204, which can be in direct contact with the surface of the substrate 201, can include silicon, and may consist essentially of silicon. The film 204 may facilitate separation between the substrate 201 and semiconductor layers overlying the film 204 as described herein.

As illustrated in FIG. 2A, the film 206 can overly, and more particularly, can be in direct contact with the film 204. The film 206 can have suitable crystallographic features for epitaxial formation of subsequent layers formed thereon. Notably, in one embodiment, the film 204 can include a semiconductor material. Suitable semiconductor materials can include a Group III-V compound material. In one particular instance, the film 206 can include a nitride material. In another example, the film 206 can include gallium, aluminum, indium, and a combination thereof. Still, in one particular embodiment, the film 206 can comprise aluminum nitride, and more particularly, the film 206 can consist essentially of aluminum nitride.

In an exemplary structure, the buffer layer 203 can be formed such that the film 204 includes silicon and is directly contacting a major surface of the substrate 201. Furthermore, the film 206 can directly contact a surface of the film 204 and include a Group III-V material.

After forming a buffer layer at step 103, the process can continue at step 105 by forming a base layer overlying the buffer layer 203. Referring briefly to FIG. 2A, the semiconductor substrate 200 can include a base layer 205 overlying the buffer layer 203. In particular, the base layer 205 can be formed such it is overlying a surface of the buffer layer 203, and more particularly, the base layer can be in direct contact with the film 206 of the buffer layer 203.

It will also be appreciated that the formation of semiconductor substrates according to embodiments herein may be achieved without necessarily the creation of an intrinsic mask, modifying the surface of the substrate via grooving or roughening, or utilization of etching techniques.

According to an embodiment, upon suitably forming a buffer layer 203, the substrate 201 and buffer layer 203 may be placed within a reaction chamber to conduct an epitaxial growth process. The growth process may be a continuous epitaxial growth process carried out in a single chamber, without removing the workpiece (e.g., semiconductor substrate) from the chamber. More particularly, the continuous growth process can include hydride vapor phase epitaxy (HVPE).

For example, the base layer 205 can be formed through an epitaxial growth process, such as hydride vapor phase epitaxy (HVPE). In one particular instance, the base layer 205 can be made of a Group III-V material. Some suitable Group III-V materials can include nitride materials. Furthermore, the base layer 205 may include gallium. In particular instances, the base layer 205 may include gallium nitride (GaN), and more particularly, may consist essentially of gallium nitride.

Particular methods of forming the base layer 205 can be undertaken. For example, the epitaxial growth of the base layer 205 can be conducted in various growth modes, wherein a lower region 208 of the base layer 205 can be grown in a first mode, and an upper region 210 of the base layer 205 can be grown in a second mode different than the first mode. For example, in one embodiment the base layer 205 can be initially formed as an epitaxial layer grown in a 3-dimensional (3D) growth mode, such that the lower region 208 of the base layer 205 may be formed in the 3D growth mode. A 3D growth mode can include the simultaneous growth of the base layer 205 material along multiple crystallographic directions. A 3D growth process can include spontaneous formation of island features on the buffer layer 203. The spontaneously formed island features can be randomly positioned on the buffer layer 203, defining various mesas having multiple facets and valleys between the mesas.

Alternatively, or additionally, the base layer 205 can be formed using a 2 dimensional (2D) epitaxial growth mode. A 2D growth mode is characterized by preferential growth of the material in one crystallographic direction and limited growth of the crystalline material along other crystallographic directions. For example, in one embodiment, formation of a base layer 205 comprising GaN in a 2D growth mode includes preferential growth of the GaN in the c-plane (0001), such that vertical growth of the base layer material can be stabilized over lateral growth.

As indicated above, the base layer 205 can be formed using a combination of 3D and 2D growth modes. For example, the lower region 208 of the base layer 205 may be initially formed in a 3D growth mode, wherein island features are spontaneously formed and randomly arranged on the buffer layer 203 as a non-continuous layer of material, which may define a layer having a substantially non-uniform thickness. Following the 3D growth mode, growth parameters can be altered to change to a 2D growth mode, wherein vertical growth is accelerated over lateral growth. In this manner, the upper region 210 of the base layer 205 can be formed through a 2D growth mode. Upon switching from a 3D growth mode to a 2D growth mode, the spontaneously formed island features may coalesce partially or totally. In certain instances, the 2D growth can be conducted long enough to facilitate total coalescence of the island features into a single, continuous layer of substantially uniform thickness. Combining 3D and 2D growth modes can facilitate reduction of the dislocation density of the base layer 205 and altering (e.g., increasing) the internal strain on the base layer 205.

It will be appreciated that formation of the base layer 205 can include multiple changes in growth modes. For example, in one embodiment, the base layer can be formed by an initial 3D growth mode, followed by a 2D growth mode, and further growth in a 3D growth mode.

Switching between growth modes may be completed by modification of certain growth parameters including growth temperature, growth rate, pressure of vapor phase reactant and non-reactant materials, ratio of reactant and non-reactant materials in the reaction atmosphere, growth chamber pressure, and a combination thereof. Reference herein to a reactant material includes reactant materials such as nitrogen-containing materials, such as ammonia. Other reactant materials can include halide phase components, including for example, metal halide components such as gallium chloride. Non-reactant materials can include certain types of gases, including for example, noble gases, inert gases, and the like. In particular instances the non-reactant material can include gases such as nitrogen and or hydrogen.

During formation of the base layer 205, including production of the base layer 205 in a 3D growth mode, the growth temperature can be at least about 750° C. In other embodiments, the growth temperature can be greater, such as at least about 800° C., at least about 850° C., at least about 875° C., at least about 900° C., or even at least about 925° C. According to one method of forming, the growth temperature during formation of the base layer 205 can be not greater than about 1200° C., such as not greater than about 1150° C., not greater than about 1125° C., not greater than about 1050° C., or even not greater than about 1000° C. It will be appreciated that the growth temperature can be within a range between any of the minimum and maximum values noted above.

For certain processes, the growth temperature may be changed to facilitate a change between 3D and 2D growth modes. In one embodiment, change of the growth temperature can include an increase in the growth temperature to change from a 3D to a 2D growth mode. For example, in changing from a 3D to a 2D growth mode, the temperature may be changed by at least about 5° C., such as at least about 10° C., at least about 15° C., at least about 20° C., at least about 30° C., at least about 35° C., or even at least about 40° C. In still other embodiments, in changing from a 3D to a 2D growth mode, the growth temperature can be changed by not greater than about 100° C., such as not greater than about 90° C., not greater than about 80° C., not greater than about 70° C., or even not greater than about 60° C. It will be appreciated that the change in growth temperature can be within a range between any of the minimum and maximum values noted above.

In accordance with embodiment, the process of forming the base layer 205 can be conducted at a growth rate of at least 50 microns per hour (microns/hr). In other embodiments, the rate of forming the base layer 205 can be greater, such as at least about 75 micron per hours, at least about 100 microns per hour, at least about 150 microns per hour, at least about 200 microns per hour, or even at least about 250 microns per hour. In another embodiment, the process of forming the base layer 205 can be conducted at a rate of not greater than about 1 mm per hour, such as not greater than 750 microns per hour not great 500 microns per hour, or even not greater than about 300 microns per hour. It will be appreciated the process of forming the base layer can be constructed at a rate within a range within any of the minimum maximum values noted above.

For certain processes, the growth rate may be changed to facilitate a change between 3D and 2D growth modes. For example, the growth rate can be decreased in changing from a 3D to a 2D growth mode. In particular, changing from 3D to 2D growth can include altering the growth rate by at least about 5 microns per hour (i.e., microns/hr), such as at least about 10 microns per hour, at least about 15 microns per hour, at least about 20 microns per hour, at least about 40 microns per hour, at least about 50 microns per hour, or even at least about 75 microns per hour. In still other embodiments, in changing from a 3D to 2D growth mode, the growth rate can be changed by not greater than about 200 microns per hour, such as not greater than about 175 microns per hour, not greater than about 150 microns per hour, not greater than about 125 microns per hour, or even not greater than about 100 microns per hour. It will be appreciated that the change in growth rate can be within a range between any of the minimum and maximum values noted above. It will be appreciated that the change in growth rate can be a decrease in the growth rate when changing from a 3D to a 2D growth mode.

According to other embodiments, the process of changing from 3D to 2D growth modes may be induced by a change in growth rate by at least a factor of 2. For example, the growth rate can be decreased by a factor of at least 2 in changing from a 3D growth mode to a 2D growth mode. In other embodiments, the growth rate can be decreased by a factor of at least about 3, at least about 4, or even at least about 5. In particular instances, the decrease in the growth rate is not greater than about a factor of 8, not greater than a factor of about 7, or not greater than a factor of about 6.

It will be appreciated that in changing the growth mode, one or more of the above-identified factors can be changed. For example, the growth temperature can be changed, while the growth rate is held steady. Alternatively, the growth rate can be changed while the growth temperature is maintained. And still, in another embodiment, both the growth rate and growth temperature may be changed to effectuate the change in growth modes.

After suitably forming the base layer 205, the average thickness of the base layer 205 can be not great than about 5 mm. In other embodiments, the average thickness of the base layer 205 can be less, such as not greater than about 4 mm, not greater than 3 mm, not greater than about 2 mm, or even not greater than about 1.5 mm Still, it will be appreciated that the base layer 205 can be formed such as that it has an average thickness of at least about 0.1 mm, such at least 0.2 mm, at least 0.5 mm, at least 0.8 mm, or even at least 1 mm. It will be appreciated that the base layer 205 can have an average thickness within a range of any of the minimum of maximum values noted above, including for example, within a range between 0.1 mm and about 5 mm.

The base layer 205 can be formed to have a particular dislocation density. The dislocation density of the base layer 205 can be measured at the upper surface of the base layer upon forming A suitable method of measuring the dislocation density includes use of cathode luminescence microscopy operated at room temperature and polychromatic light detection without monochromator under 10 keVe-beam, spot size 70, wherein the machine is an SEM JSM-5510, commercially available from JEOL Corporation. For a dislocation density measurement of approximately $10^8$ cm$^{-2}$, the magnification is 4000× and the area is typically 700 μm$^2$. For a dislocation density measurement of approximately $10^6$ cm$^{-2}$ density measurement, the magnification is typically 500-1000× and the area is typically 0.1 mm$^2$ According to one embodiment, the base layer 205 can have a dislocation density of not greater than about 1×10$^8$ dislocation/cm$^2$, as measured at an upper surface of the base layer 205. In other embodiments, the dislocation density of the base layer 205 can be less, such that it is not greater than about 1×10$^7$ dislocation/cm$^2$, not greater than about 6×10$^6$ dislocation/cm$^2$, or even not greater than about 1×10$^6$ dislocation/cm$^2$. Still, the base layer 205 may have a dislocation density that is at least about 1×10$^5$ dislocation/cm$^2$, such as at least 2×10$^5$ dislocation/cm$^2$, at least 3×10$^5$ dislocation/cm$^2$, or even at least 5×10$^5$ dislocation/cm$^2$. It will be appreciated that the base layer can have a dislocation density within a range within any of the minimum and maximum values noted above.

After forming the base layer at step 105, the process can continue at step 107 by cooling the base layer. Cooling can include a reduction of the temperature within the growth chamber from the growth temperature utilized to form the base layer 205. Cooling can also include reducing the temperature of the semiconductor substrate 200 (i.e., substrate 201, buffer layer 203, and base layer 205), which may or may not necessarily include cooling of the growth chamber. For example, the semiconductor substrate 200 may be removed from the growth chamber, while the growth chamber remains at or near the growth temperature.

Cooling may include reducing the temperature of the growth chamber or the semiconductor substrate 200 to a cooling temperature. The cooling temperature can be significantly below the growth temperature used for epitaxial growth. For example, the cooling temperature can be at least about 100° C. below the growth temperature. In other instances, the cooling temperature can be at least about 150° C., such as at least about 200° C., at least about 250° C., at least about 300° C., at least about 350° C., at least about 400° C., at least about 450° C., or even at least about 500° C. below the growth temperature.

In particular instances, the cooling temperature may be at least about 0° C., such as at least about 20° C., at least about 50° C., at least about 80° C., at least about 100° C., at least about 150° C., at least about 200° C., or even at least about 300° C. The cooling temperature may be not greater than about 700° C., such as not greater than about 650° C., not greater than about 600° C., not greater than about 500° C., not greater than about 400° C., or even not greater than about 350° C. It will be appreciated that the cooling temperature can be within a range within any of the minimum and maximum temperatures noted above.

During the process of forming the base layer 205, the semiconductor substrate 200 may develop a bow or curvature due to internal strain within the base layer 205. The cooling process may be undertaken to reduce the bow. Cooling can also reduce the strain within the base layer 205, which is built up during the forming process.

In one particular instance, cooling can facilitate cracking of the base layer 205, which can facilitate reduction in the internal strain within the base layer 205. As illustrated in FIG. 2A, cracks 255 may be formed in the base layer 205 during cooling. The cracks can extend through the volume of the base layer 205 and may be initiated or terminated at the interface between the base layer 205 and the buffer layer 203. In some embodiments, at least one crack 255 within the base layer 205 can extend through a significant portion of the thickness of the base layer 205.

In accordance with one embodiment, cooling can include changing the temperature of the reaction chamber or the semiconductor substrate 200 (i.e., substrate 201, buffer layer 203, and base layer 205) at a particular cooling rate to facilitate reduction of strain and induce cracking. For example, the cooling rate can be at least about 100° C./hr. In other embodiments, the cooling rate can be at least about 200° C./hr, such as at least about 300° C./hr, at least about 400° C./hr, at least about 500° C./hr, or even at least about 600° C./hr. Still, the cooling rate may be not greater than about 2000° C./hr, such as not greater than about 1000° C./hr, or even not greater than about 800° C./hr. It will be appreciated that the cooling rate can be within a range within any of the minimum and maximum ranges noted above.

The cooling process may utilize different cooling rates. For example, initially the cooling rate may be greater than a cooling rate used at the end of the cooling process. Such a process may facilitate the formation of desirable features, such as cracks, within the material. Alternatively, a particularly greater cooling rate may be utilized over a particular range of temperatures, including for example, a short range of temperatures in the initial stages or the middle stages of the cooling cycle.

The cooling process may be assisted by the introduction of a particular cooling medium within the reaction chamber. For example, one particular cooling medium includes a gaseous material. The cooling medium can have a temperature lower than the temperature of the reaction chamber during epitaxial growth processes.

Additionally, or alternatively, the atmosphere within the reaction chamber during cooling can be controlled. For example, a cooling atmosphere may be supplied within the reaction chamber to facilitate cooling of the semiconductor substrate 200. Some suitable cooling atmospheres can include a reducing atmosphere, oxidizing atmosphere, or inert atmosphere. Particularly suitable gaseous materials can include nitrogen or noble gases, such as argon or helium. In particular instances, the cooling atmosphere can include a hydrogen containing gas, such as a hydrogen-containing composition, including for example ammonia ($NH_3$), hydrogen ($H_2$), and a combination thereof. For example, the cooling atmosphere can include a mixture of nitrogen and ammonia. According to one particular embodiment, the cooling atmosphere may contain a mixture of ammonia and hydrogen gases. In an alternative embodiment, the cooling atmosphere may contain a mixture of helium and a hydrogen-containing gas.

Other means of cooling the reaction chamber can include applying cooling means to the structure of the chamber. For example, the chamber may optionally have a cooling system designed to cool the structure of the reaction chamber in a controlled manner.

After conducting the cooling process at step 107, the process can continue at step 109 by forming a bulk layer overlying the base layer. Notably, a growth process within the reaction chamber can be continued. Accordingly, the process of forming the bulk layer may be initiated by increasing the temperature within the reaction chamber for those processes wherein cooling includes reducing the temperature of the reaction chamber.

Figure 2B:
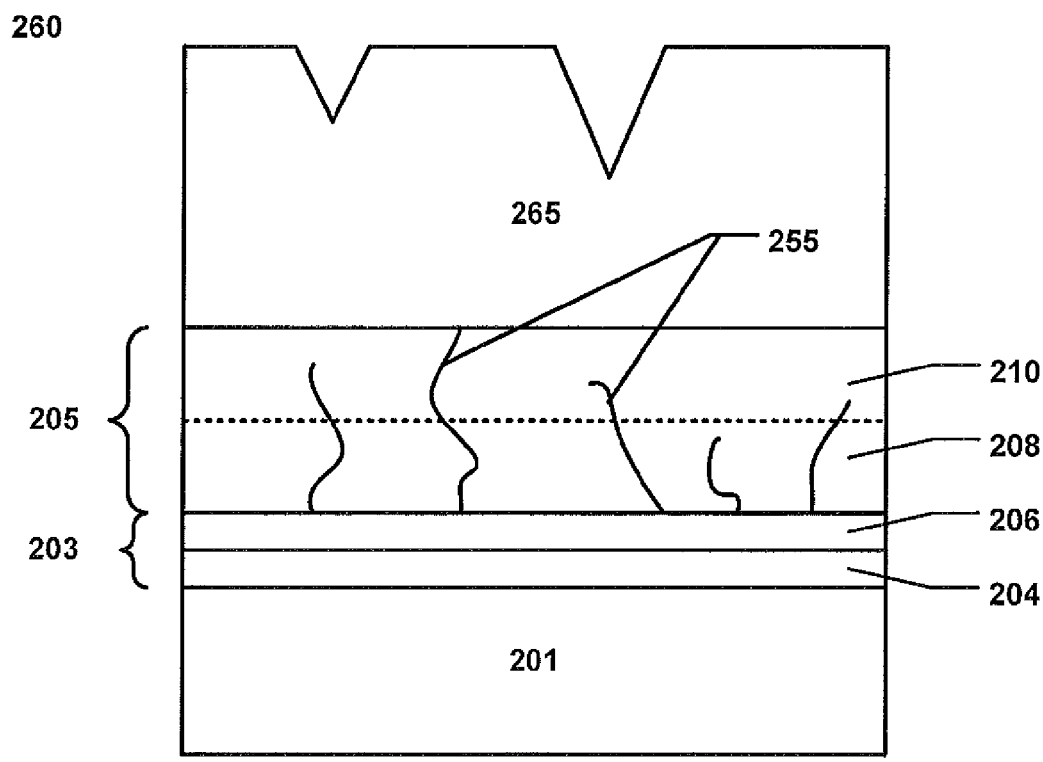

Referring briefly to FIG. 2B, the semiconductor substrate 260 can include a bulk layer 265 formed on a base layer 205 overlying the buffer layer 203 and substrate 201. In particular, the bulk layer 265 can be formed such it is overlying a surface of the base layer 205, and more particularly, the bulk layer 265 can be in direct contact with the base layer 205.

The process of forming the bulk layer 265 can include an epitaxial growth process utilizing one or more growth modes as noted herein. However, in particular instances, formation of the bulk layer 265 can include formation through a 3D growth mode. More particularly, the formation of the bulk layer 265 can be completed exclusively in a 3D growth mode. Formation of the bulk layer 265 in a 3D growth mode, when combined with other features of the embodiments herein has been unexpectedly discovered to form a layer with limited or no strain. The bulk layer 265 can be formed into a thick layer of material with little to no bowing or curvature. Notably, growth of the bulk layer 265 in a 3D growth mode can facilitate the upper surface of the bulk layer 265 defined by a plurality of mesas having multiple facets and valleys between the mesas.

The bulk layer 265 can be formed such that cracks formed within the base layer 205 during cooling do not necessarily propagate into the bulk layer 265. That is, the growth process of the bulk layer 265 can be conducted in a manner such that the cracks within the base layer 205 terminate at the interface of the base layer 205 and the bulk layer 265, and cracks do not extend into the volume of the bulk layer 265. Accordingly, within the semiconductor substrate 260, the cracks can be primarily present within the base layer 205, and more particularly, the cracks can be exclusively within the base layer 205.

In a particular instance, the bulk layer 265 can include a Group III-V material. In particular instances, the bulk layer 265 can include a nitride material. In still another embodiment, the bulk layer 265 can include gallium, and more particularly, may include gallium nitride. For example, the bulk layer 265 may consist essentially of gallium nitride.

Moreover, formation of the bulk layer 265 can include provision of a dopant material, such that the final-formed semiconductor substrate has properties suitable for use in fabricating electronic devices. Some suitable dopant materials can include elements such as C, Mg, Zn, Si, Sn, O, Fe, Ge and a combination thereof. In certain instances, the bulk layer 265 can have a dopant concentration that is less than about $2 \times 10^{18}$ cm$^{-3}$. In other instances, a dopant concentration can be as high as $5 \times 10^{19}$ cm$^{-3}$ for higher electrical conductivity. It will be appreciated that the dopant concentration within the base layer 205 and the bulk layer 265 can be substantially the same, and more particularly, significantly less than the dopant concentration within the release layer 207.

In accordance with embodiment, the bulk layer 265 can be grown at substantially the same rate as the base layer 205. The bulk layer 265 may be formed such it has an average thickness that is significantly greater than the average thickness of the base layer 205. For example, the bulk layer 265 can be formed such as it has an average thickness of at least about 1 mm. In other embodiments, the average thickness may be greater, such as at least about 1.5 mm, at least about 2 mm, at least about 2.5 mm, at least about 3 mm, at least about 4 mm, or even at least about 5 mm Still, the bulk layer 265 may be formed such that it has an average thickness that is not greater than about 10 mm, or even not greater than about 8 mm. It will be appreciated that the bulk layer 265 can have an average thickness within a range between any of the minimum and maximum values noted above.

The bulk layer 265 may be formed to have a particular dislocation density as measured in upper surface. In particular embodiments, the bulk layer 265 can have a dislocation density that is not greater than about $1 \times 10^{8}$ dislocations/cm$^{2}$, such as not greater than about $1 \times 10^{7}$ dislocations/cm$^{2}$, or even not greater than about $1 \times 10^{6}$ dislocations/cm$^{2}$. In other embodiments, the bulk layer 265 can have a dislocation density that is at least about $1 \times 10^{5}$ dislocations/cm$^{2}$, such as at least $2 \times 10^{5}$ dislocations/cm$^{2}$, or even at least $5 \times 10^{5}$ dislocations/cm$^{2}$. It will be appreciated that the bulk layer 265 can have a dislocation density within a range between any of the minimum and maximum values noted above.

During the forming process, the base layer 205 and the bulk layer 265 can be separated from the substrate 201. The separation can be facilitated by the dissociation of a portion of the buffer layer 203, and particularly, a film within the buffer layer 203. In accordance with an embodiment, the buffer layer 203 can include a film (e.g., film 204) including silicon, wherein at elevated temperatures utilized during the epitaxial growth process, the film is thermally dissociated. Thermal dissociation facilitates separation between the substrate 201 and the plurality of semiconductor layers (i.e., the base layer 205 and the bulk layer 265) overlying the buffer layer 203. Accordingly, upon completion of the continuous growth process, the base layer 205 and bulk layer 265 can be completely removed from the substrate 201.

Figure 2C:
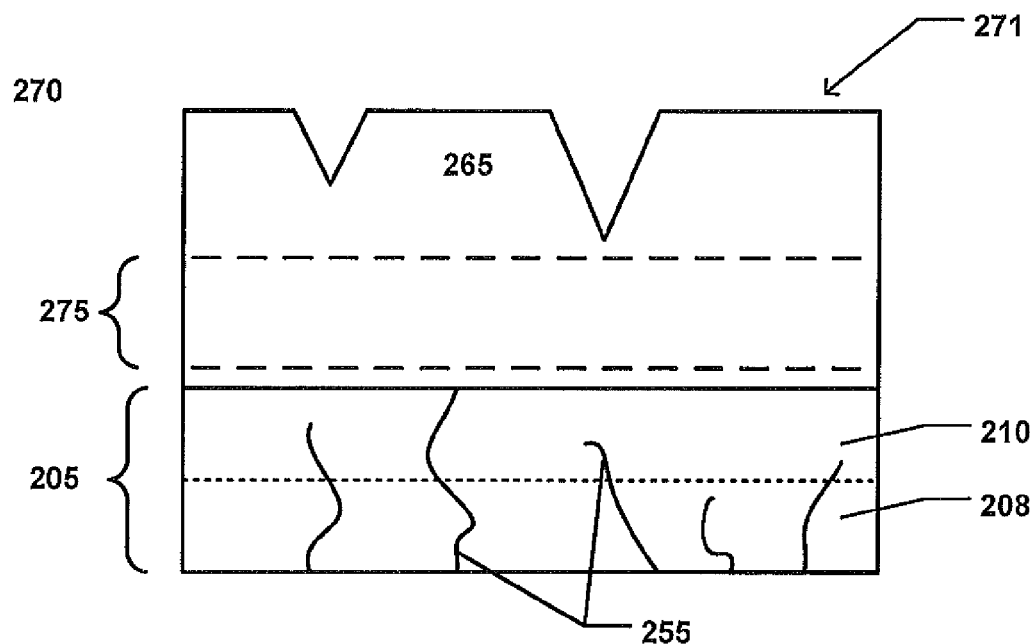

Turning to FIG. 2C, a semiconductor substrate 270 is illustrated having a plurality of semiconductor layers including the base layer 205 and bulk layer 265. After release of the substrate 201 from the semiconductor substrate 270, further processing may be completed. In particular, after forming the bulk layer 265, the process can continue at step 111 by removing the bulk layer 265 from the base layer 205. One such process can include grinding of the semiconductor substrate 270 to reduce the overall thickness of the semiconductor layers (i.e., base layer 205 and bulk layer 265). In particular, removing the base layer 205 can include a back grinding process to remove the base layer 205 using grinding, lapping, and/or polishing processes. Furthermore, the upper surface 271 of the bulk layer 265 can be subject to a material removal process including grinding, lapping, and/or polishing, to facilitate smoothing the upper surface 271 and reducing the thickness of the bulk layer 265. Notably, polishing of at least the upper surface 271 may be undertaken to provide a mirror finish to the substrate formed from the bulk layer 265.

Removing the base layer 205 from the bulk layer 265 and removing material from the upper surface 271 of the bulk layer 265 facilitates a reduction in thickness of the substrate 270. Notably, the bulk layer 265 may be reduced to a particular thickness defined by a region 275 within the bulk layer 265, which may be targeted as a region suitable for forming the final-formed semiconductor substrate.

Figure 2D:
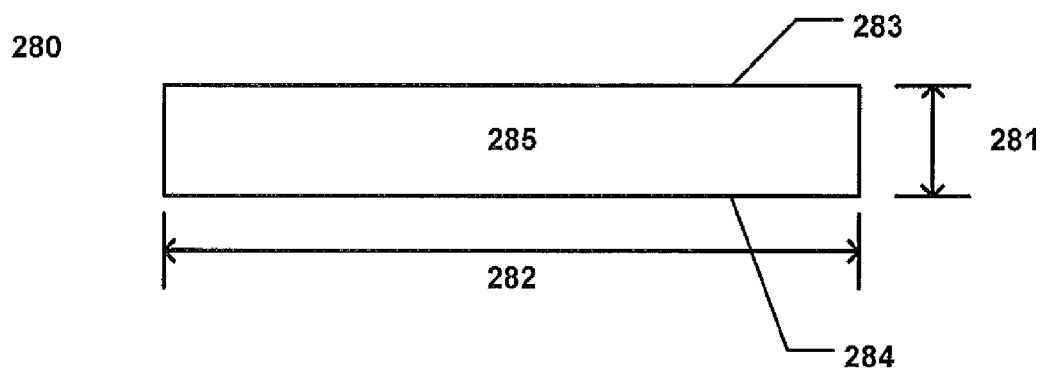

FIG. 2D includes a cross-sectional illustration of a semiconductor substrate formed according to the embodiments herein. The final-formed semiconductor substrate 280 can be formed from the region 275 of the bulk layer 265 illustrated in FIG. 2C. The semiconductor substrate 280 can have the same attributes as the bulk layer 265.

According to one embodiment, the semiconductor substrate 280 can have a body 285 comprising a nitride, and more particularly comprising gallium nitride, and still more particularly, consisting essentially of gallium nitride.

The body 285 of the semiconductor substrate 280 can have a dislocation density not greater than about $1 \times 10^{8}$ dislocations/cm$^{2}$, such as not greater than about $1 \times 10^{7}$ dislocations/cm$^{2}$, or even not greater than about $1 \times 10^{6}$ dislocations/cm$^{2}$. In other embodiments, the body 285 of the semiconductor substrate 280 can have a dislocation density that is at least about $1 \times 10^{5}$ dislocations/cm$^{2}$, such as at least $2 \times 10^{5}$ dislocations/cm$^{2}$, or even at least $5 \times 10^{5}$ dislocations/cm$^{2}$. It will be appreciated that the body 285 can have a dislocation density within a range between any of the minimum and maximum values noted above.

The body 285 of the semiconductor substrate 280 can be formed such that it has an average thickness 281 of at least about 100 microns. In other instances, the average thickness 281 of the body 285 may be greater, such as at least about 150 microns, at least about 200 microns, at least about 250 microns, or even at least about 300 microns. Still, the average thickness 281 of the body 285 may be not greater than about 700 microns, such as not greater about 600 microns, or even not greater than about 500 microns. It will be appreciated that the body 285 can have an average thickness 281 within a range between any of the minimum and maximum values noted above.

Generally, the semiconductor substrate 280 can have a body 285 having a disc-like shape. The body 285 can have a diameter or width 282 of at least about 4 cm, such as at least about 5 cm, at least about 6 cm, at least about 6.5 cm, or even at least about 8 cm. In certain instances, the diameter of the body 285 may be not greater than about 20 cm.

Notably, the body 285 of the semiconductor substrate 280 can be formed to have a particular bow. The bow is measured as the maximum deviation of the surface from a plane defined as the best least squared fit to the surface of the substrate. That is, for example, the curvature of the body 285 can be notably low, demonstrating substantially little to no bowing. According to one embodiment, the body 285 can have a bow that is less than about 200 microns. In other instances, the bow can be less, such as not greater than about 100 microns, not greater than about 75 microns, not greater than about 50 microns, not greater than about 25 microns, or even not greater than about 10 microns.

The bow is measured as the difference: $zC-0.25\times(zS+zN+zE+zW)$, where $zC$ is the height of a point located in the center of the body 285, and the notations $zS$, $zN$, $zE$ and $zW$ represent the height of the four points located at 24 mm from the center point and regularly spaced by 90° around the center point. The height is measured along an axis $z$ essentially perpendicular to the surface of the substrate 285 in its center. The bow value being very small compare to the substrate diameter, the perpendicular direction can be the normal to a reference plane of the measurement tool on which the substrate is laying.

It will be appreciated that the body 285 can have a diameter of at least about 2 inches, such as at least about 3 inches, at least about 4 inches, at least about 5 inches, and at least about 6 inches. In particular instances, the body 285 can have a diameter of not greater than about 15 inches.

The bow of the body 285, in some instances, can correspond to a radius of curvature of at least about 1.5 m. In other cases, the bow of the body 285 can correspond to a radius of curvature of at least about 1.8 m, at least about 2 m, at least about 2.5 m, at least about 3 m, at least about 5 m, or even at least about 10 m.

Notably, the body 285 of the semiconductor substrate 280 can be formed to have a particular crystalline bow. The crystalline bow is measured as the curvature of the crystalline material within the body of the semiconductor substrate as a deviation from a perfectly planar crystalline morphology. A measure of the crystal is performed by X ray diffraction following methods disclosed in Chapter 4.3.5 in the book "X-ray scattering from semiconductors" by Paul F. Fewster, based on the formula 4.12 for deriving the radius of curvature $R=(X_1-X_2)/(\omega_1-\omega_2)$. That is, for example, the curvature of the body 285 can be notably low, demonstrating substantially little to no bowing. According to one embodiment, the body 285 can have a crystalline bow that is less than about 200 microns. In other instances, the bow can be less, such as not greater than about 100 microns, not greater than about 75 microns, not greater than about 50 microns, not greater than about 25 microns, or even not greater than about 10 microns.

According to the manner of processing described in the embodiments herein, it has been discovered that certain semiconductor substrates can have particular crystallographic characteristics. Notably, the body 285 of the semiconductor substrate 280 can have a X-ray diffraction scan profile having a dual-peak signature. An X-ray diffraction scan profile includes a scan of at least 8 distinct points on a line extending through a center point on the upper surface 283 (i.e., Ga-face) of the body 285. The X-ray diffraction scan profiles are recorded using a commercial set up (Pananalytical X'Pert PRO MRD) with the Cu K$\alpha$1 line without collimation slit on the X ray source operated at 45 kV/40 mA. The rocking curve $\omega$-scan profiles are recorded at the different locations for the (0002) reflections.

A dual-peak signature can be characterized by a single curve of the X-ray diffraction scan profile having two distinct peaks or maximas for the same scan point on the surface of the body 285. Notably, a dual-peak signature can have first and second peaks that are part of the same curve, wherein the first and second peaks are disposed between portions of the curve that intersect a substantially zero or a background intensity. A dual-peak signature may appear on a X-ray diffraction scan profile as a curve having a bimodal distribution with different means.

According to one embodiment, the dual-peak signature includes a first peak and a second peak spaced apart from each other. The first peak and second peak can be spaced apart from each other by not greater than about 2 degrees. The separation between the first and second peaks is measured as the distance along the x-axis between the maximas defining the first and second peaks. In other embodiments, the first and second peaks of the dual-peak signature can be spaced apart from each other by not greater than about 1 degree, not greater than about 0.5 degrees, not greater than about 0.3 degrees, or even not greater than about 0.2 degrees. Still, the spacing between the first and second peak can be at least about 0.001 degrees, such as at least about 0.005 degrees. It will be appreciated that the spacing between the first and second peaks of the dual-signature peak can be spaced apart within a range between any of the minimum and maximum values noted above.

The dual-peak signature can include a first peak having a first intensity and a second peak having a second intensity that is significantly different than the first intensity. According to one embodiment, the first peak intensity (PI1) and the second peak intensity (PI2) can have intensity values differing by at least 5% based on the equation $\Delta PI=[(PI1-PI2)/PI1]\times 100\%$, wherein PI1 is greater than PI2. In other instances, the difference between the first peak intensity (PI1) and the second peak intensity (PI2) can be at least about 10%, such as at least about 12%, at least about 16%, at least about 18%, at least about 22%, at least about 24%, at least about 28%, or even at least about 30%. In certain other instances, the difference between the first peak intensity (PI1) and the second peak intensity (PI2) may be not greater than about 95%, such as not greater than about 90%, not greater than about 85%, not greater than about 80%, or not greater than about 75%. It will be appreciated that the difference between the first peak intensity (PI1) and the second peak intensity (PI2) can be within a range between any of the minimum and maximum percentages noted above.

The body 285 of the semiconductor substrate 280 can be characterized by a X-ray diffraction scan profile having at least one single peak signature spaced apart from the dual-peak signature. For example, in reviewing a plot of the X-ray diffraction scan profile, the body 285 can have a dual-peak signature associated with one point of measurement on the surface 283 of the body 285 and a single peak signature associated with a separate point of measurement along the surface 283 of the body 285. According to one embodiment, the single peak signature can have a full-width half maximum value of not greater than about 180 arc seconds)(0.050°.

Furthermore, the body 185 of the semiconductor substrate 280 can have a particular separation between the dual-peak signature and the single-peak signature on the X-ray diffraction scan profile. The separation between the dual-peak signature and the single peak signature is measured as the closest distance between a maxima of the dual-peak signature and the maxima defining the single-peak signature. According to one embodiment, the separation distance between the dual-peak signature and the single peak signature peaks can be at least about 0.01 degrees, such as at least about 0.05 degrees, at least about 0.08 degrees, at least about 0.1 degrees, or even at least about 0.3 degrees. Still, the separation between the dual-peak signature and the single-peak signature can be not greater than about 2 degrees, not greater than about 1.5 degrees, or even not greater than about 1 degree. It will be appreciated that the spacing between the dual-peak signature and the single-peak signature can be within a range between any of the minimum and maximum values noted above.

Additionally, the dual-peak signature may have a first peak (i.e., maxima) having a significantly greater intensity than a second peak (i.e., maxima) of the dual-peak signature. In one embodiment, the intensity of the first peak of the dual-peak signature can have a value that is significantly less than an intensity associated with a peak of any single-peak signature within the same X-ray diffraction scan profile. A significantly different peak intensity can be a measurable difference in peak intensity as demonstrated from the X-ray diffraction scan profile. In one particular instance, the difference in the intensity between the intensity of the first peak of the dual-peak signature and the intensity of the peak of the single-peak signature can be at least about 1%, such as at least about 3%, at least about 5%, at least about 7%, or even at least about 10%. In certain other instances, the difference between the first peak intensity and the peak intensity of the single-peak signature may be not greater than about 98%, such as not greater than about 95%, not greater than about 90%, not greater than about 85%, or not greater than about 75%. It will be appreciated that the difference between the first peak intensity and the peak intensity of the single-peak signature can be within a range between any of the minimum and maximum percentages noted above.

EXAMPLE 1

A sample is formed according to an embodiment by first growth of a two part buffer layer via MOVPE on a sapphire substrate. The buffer layer includes a first layer of silicon directly on the sapphire substrate, followed by epitaxial growth of AlN. After loading the sapphire substrate in the MOVPE reactor, the sapphire substrate has to be annealed under $N_2$ before growth of the silicon film. Preferably the temperature 870° C. Silicon growth is formed from pyrolysis of silane in the $N_2$ atmosphere at 100 torrs to a thickness of about 0.4 microns.

The temperature is raised to about 1140° C., the growth vapor still being pure $N_2$ at 70 torrs. $NH_3$ is first introduced into the reaction chamber, and thereafter, a TMAl organometallic material is introduced to begin forming the AlN layer on the silicon. After approximately 20 minutes of growth, a 0.2 µm thick AlN layer is deposited on top of the Si layer, forming the buffer layer.

Manufacturing of the base layer is initiated by growth of GaN on the AlN layer via HVPE. Growth is initiated in a 3D growth mode conducted at 950° C. with a growth rate of approximately 150 µm/h. The pressure in the growth chamber is approximately 200 torrs and the V/III ratio is about 10.

After sufficient formation of GaN growth in 3D growth mode, a transition from 3D to 2D growth mode is obtained at a constant low temperature of approximately 950° C. and the growth rate is decreased by a factor 5-6 by decreasing the GaCl partial vapor pressure in the growth chamber. The total pressure in the growth chamber is kept constant.

The growth modes are alternated, such that a base layer of about 1 mm thick is formed using the following sequence: 350 µm 3D+50 µm 2D+350 µm 3D+50 µm 2D+200 µm 3D.

After forming the base layer, the GaN base layer can be cooled by cooling the reaction chamber to room temperature at a cooling rate of approximately 200° C./hr. During cooling the pressure of NH3 within the reaction chamber is maintained to avoid thermal decomposition of the GaN base layer.

After cooling, the reaction chamber is once again heated to conduct final HVPE growth of a GaN bulk layer overlying the base layer. The thickness for the bulk layer can be determined by the pit depths. Generally, the GaN bulk layer is growth to a thickness of at least 3.5 mm in 3D growth mode to fill the pits to a sufficient degree. The growth conditions for the bulk layer include a growth rate approximately 150 µm/h, a growth temperature of 950° C., a V/III ratio of 10, and a pressure of 200 torrs.

The sample of Example 1 demonstrated a XRD rocking curve of (0002) having a FWHM of 50 ArcSec, measured on the cracked blanks. The threading dislocation density was also measured at $3 \times 10^6$ cm$^{-2}$, with cathodoluminescence scanning according to the methods described herein.

Figure 3:
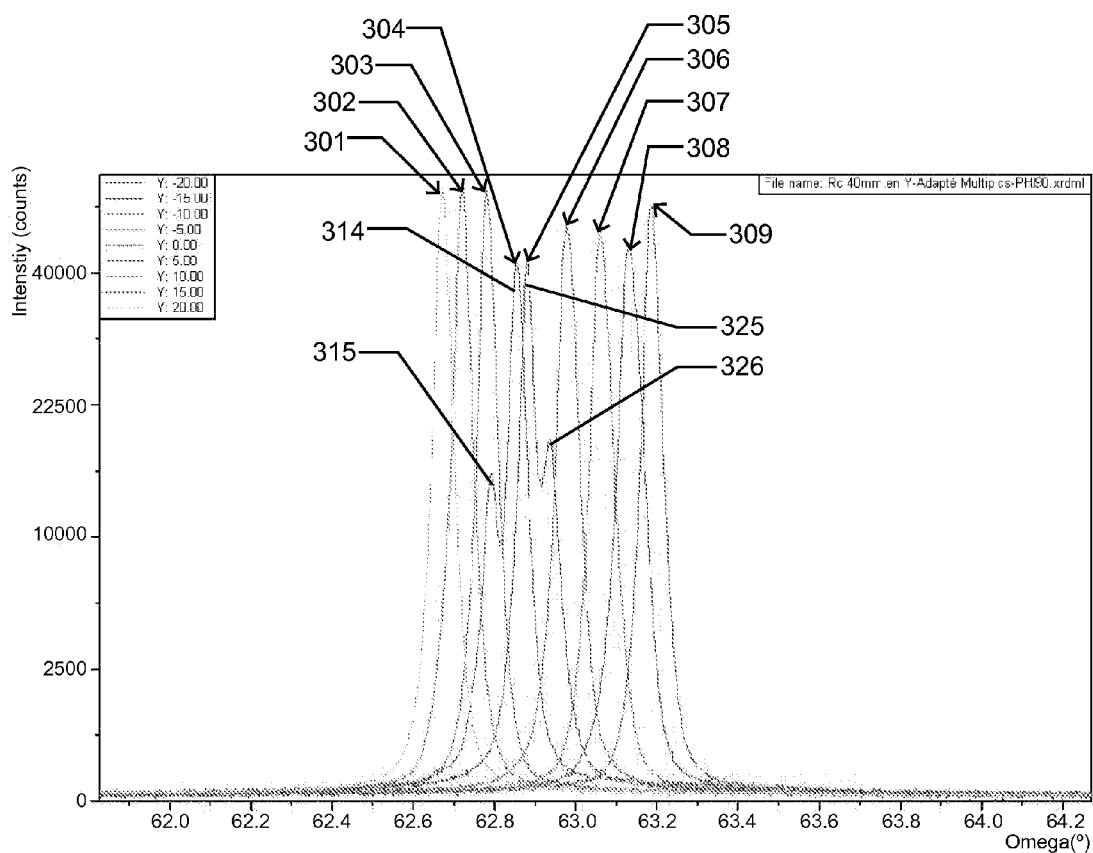
FIG. 3 includes an X-ray diffraction scan profile having a dual-peak signature for a substrate formed according to an embodiment.

FIG. 3 includes an X-ray diffraction scan profile having a dual-peak signature for the substrate of Example 1. As illustrated, the semiconductor substrate of Example 1 demonstrates 9 distinct peak curves labeled 301, 302, 303, 304, 305, 306, 307 308, and 309, respectively. Each of the 9 peak curves represent 9 different locations on the surface of the substrate of Example 1 where an X-ray diffraction measurement was taken according to the methods noted herein. Peak curves 304 and 305 represent dual-peak signatures. In particular, peak curve 304 has a first peak 314 and a second peak 315. The first peak 314 has an intensity of 41248 and the second peak 315 has an intensity of 15349. Thus, the first peak 314 and the second peak 315 have a difference in intensity values of approximately 63%. The peak 314 is located at 62.855 degrees and the peak 315 is located at 62.793 degrees. Accordingly, the separation between the peaks 314 and 315 of the dual-peak signature is approximately 0.062 degrees.

Peak curve 305 of the X-ray diffraction scan profile represent dual-peak signature having a first peak 325 and a second peak 326. The first peak 325 has an intensity of 41524 and the second peak 326 has an intensity of 18723. Thus, the first peak 325 and the second peak 326 have a difference in intensity values of approximately 55%. The peak 325 is located at 62.881 degrees and the peak 326 is located at 62.936 degrees. Accordingly, the separation between the peaks 325 and 326 of the dual-peak signature is approximately 0.055 degrees.

The peak curves 301, 302, 303, 306, 307, 308 and 309 all represent single-peak signatures of the X-ray diffraction scan profile of the substrate of Example 1. The single-peak signatures of the peak curves 301, 302, 303, 306, 307, 308 and 309 each have a single maximum and define a single mean. Each of the single-peak signature peak curves 301, 302, 303, 306, 307, 308 and 309 have intensity values (as measured at the respective maxima) that are significantly greater than the intensity values of the peaks 314, 315, 325, or 326. The intensity values of the peaks 301, 302, 303, 306, 307, 308 and 309, are 53284, 53866, 52623, 47055, 46437, 43693, and 50755, respectively. Furthermore, the FWHM values (in degrees) of the peaks 301, 302, 303, 306, 307, 308 and 309 are 0.041, 0.040, 0.041, 0.048, 0.048, 0.056, and 0.043, respectively.

The embodiments herein represent a departure from the state-of-the-art. While bulk GaN substrates have been previously formed through epitaxial techniques, such processes typically induce significant strain into the layered article resulting in significant bowing of the substrate. The present application discloses a process for forming a semiconductor substrate (e.g., GaN) including but not limited to a combination of procedures such as utilization of various growth modes, utilization of a particular order of growth modes, particular cooling processes for inducing cracking, and finishing processes, which are not recognized in the art. The particular growth process disclosed in the embodiments facilitates formation of semiconductor substrates having a combination of features, including but not limited to, substrates having particular dislocation densities, little to no bowing, particular thicknesses, and dual-peak signatures.

The above-disclosed subject matter is to be considered illustrative, and not restrictive, and the appended claims are intended to cover all such modifications, enhancements, and other embodiments, which fall within the true scope of the present invention. Thus, to the maximum extent allowed by law, the scope of the present invention is to be determined by the broadest permissible interpretation of the following claims and their equivalents, and shall not be restricted or limited by the foregoing detailed description.

The Abstract of the Disclosure is provided to comply with Patent Law and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all features of any of the disclosed embodiments. Thus, the following claims are incorporated into the Detailed Description, with each claim standing on its own as defining separately claimed subject matter.

What is claimed is:

1. A method for forming a substrate comprising: forming a buffer layer on a substrate wherein the substrate comprises sapphire, and the buffer layer comprises: a first film comprising silicon directly contacting a surface of the substrate; and a second film comprising a Group III-V material directly contacting a surface of the first film; forming a base layer comprising a Group III-V material on the buffer layer; cooling the base layer to induce cracks in the base layer, wherein the cracks are terminated at an interface between the base layer and the buffer layer; and forming a bulk layer comprising a Group III-V material directly on the base layer after cooling, wherein during forming the bulk layer, the cracks induced in the base layer do not substantially propagate into the bulk layer.

2. The method of claim 1, wherein the base layer comprises gallium nitride.

3. The method of claim 1, wherein the bulk layer comprises gallium nitride.

4. The method of claim 1, wherein forming the base layer comprises epitaxial growth of the Group III-V material in a three-dimensional growth mode.

5. The method of claim 1, wherein forming the base layer comprises epitaxial growth of the Group III-V material in a two-dimensional growth mode.

6. A method for forming a substrate comprising:
forming a buffer layer overlying a substrate comprising sapphire, wherein the buffer layer comprises:
a first film comprising silicon directly contacting a surface of the substrate; and
a second film comprising a Group III-V material directly contacting a surface of the first film;
forming a random array of island features comprising a Group III-V material overlying the buffer layer;
coalescing the random array of island features into a base layer as a continuous layer of uniform thickness comprising the Group III-V material, wherein the base layer comprises an average thickness of at least 0.5 mm to not greater than about 3 mm;
cooling the base layer and forming cracks in the base layer; and
forming a bulk layer comprising a Group III-V material on the base layer after cooling, wherein forming the bulk layer is completed exclusively in a three-dimensional (3D) growth mode.

7. The method of claim 6, wherein the cracks induced in the base layer do not propagate into the bulk layer.

8. The method of claim 6, wherein cooling is conducted at a rate of at least about 200° C./hr.

9. The method of claim 6, wherein the bulk layer comprises an average thickness of at least 1 mm.

10. The method of claim 6, wherein cooling is conducted in a cooling atmosphere comprising an atmosphere selected from the group consisting of a reducing atmosphere, an oxidizing atmosphere, and an inert atmosphere.

11. The method of claim 5, wherein the base layer comprises GaN.

12. The method of claim 5, wherein the bulk layer comprises GaN.

13. The method of claim 1, wherein forming the bulk layer comprises epitaxial growth of the Group III-V material in a three-dimensional growth mode.

14. The method of claim 1, further comprising removing the base layer from the bulk layer.

15. The method of claim 14, wherein removing comprises grinding the base layer from the bulk layer.

16. The method of claim 1, further comprising finishing an upper surface of the bulk layer.

17. The method of claim 16, wherein finishing comprises polishing at least one major surface of the bulk layer.

18. The method of claim 1, wherein cooling is conducted at a rate of at least about 200° C/hr.

19. The method of claim 1, wherein cooling comprises cooling the base layer to a cooling temperature of less than about 600° C.

* * * * *